(12) United States Patent
Park et al.

(10) Patent No.: US 10,269,495 B2
(45) Date of Patent: Apr. 23, 2019

(54) CAPACITOR COMPONENT

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 78 days.

(21) Appl. No.: 15/404,343

(22) Filed: Jan. 12, 2017

(65) Prior Publication Data

US 2017/0316882 A1    Nov. 2, 2017

(30) Foreign Application Priority Data

Apr. 27, 2016   (KR) .................. 10-2016-0051735

(51) Int. Cl.

| H01G 4/30 | (2006.01) |
|---|---|
| H01G 4/38 | (2006.01) |
| H01G 4/012 | (2006.01) |
| H01G 4/12 | (2006.01) |
| H01G 4/232 | (2006.01) |

(52) U.S. Cl.
CPC ............. *H01G 4/30* (2013.01); *H01G 4/012* (2013.01); *H01G 4/12* (2013.01); *H01G 4/232* (2013.01)

(58) Field of Classification Search
CPC .. H01G 2/24; H01G 4/35; H01G 4/38; H01G 4/30; H01G 4/228

USPC ................................................ 361/329–330
See application file for complete search history.

(56) References Cited

U.S. PATENT DOCUMENTS

| 2004/0184202 A1 | 9/2004 | Togashi et al. |
| 2008/0100988 A1 | 5/2008 | Togashi |
| 2008/0239624 A1 | 10/2008 | Togashi |

FOREIGN PATENT DOCUMENTS

| JP | 2001196263 A | * | 7/2001 |
| JP | 2004158541 A | * | 6/2004 |
| JP | 2004-253425 A | | 9/2004 |
| JP | 2008-066461 A | | 3/2008 |
| JP | 2008-251628 A | | 10/2008 |
| JP | 2015-026843 A | | 2/2015 |

(Continued)

*Primary Examiner* — Eric W Thomas
(74) *Attorney, Agent, or Firm* — Morgan Lewis & Bockius LLP

(57) ABSTRACT

A capacitor component includes a body including a plurality of dielectric layers having a layered structure and a first internal electrode and a second internal electrode alternately disposed with respective dielectric layers of the plurality of dielectric layers disposed therebetween. A first external electrode is disposed on a first surface and a second surface of the body opposing each other, and is connected to the first internal electrode. A second external electrode is disposed on at least one of a third surface and a fourth surface of the body connecting the first surface to the second surface and opposing each other, and is connected to the second internal electrode. The first internal electrode and the second internal electrode provide a plurality of resonance frequencies. In some examples, each of the first internal electrode and the second internal electrode is divided into a plurality of regions spaced apart from each other.

24 Claims, 9 Drawing Sheets

(56) References Cited

FOREIGN PATENT DOCUMENTS

| KR | 10-2007-0109145 A | 11/2007 |
| KR | 10-2009-0117686 A | 11/2009 |
| KR | 10-2014-0126083 A | 10/2014 |

* cited by examiner

CAPACITOR COMPONENT

CROSS-REFERENCE TO RELATED APPLICATION

This application claims the benefit of priority to Korean Patent Application No. 10-2016-0051735, filed on Apr. 27, 2016 with the Korean Intellectual Property Office, the entirety of which is incorporated herein by reference.

BACKGROUND

1. Field

The present disclosure relates to a capacitor component.

2. Description of Related Art

A multilayer ceramic capacitor (MLCC) is a capacitor component, and takes the form of a chip serving to charge or discharge electricity while being mounted on a printed circuit board. The MLCC can be used in a Liquid Crystal Display (LCD), a Plasma Display Panel (PDP), or the like, of various electronic products such as video cameras, computers, smartphones, mobile phones, and the like.

An MLCC may be used as a component of various electronic devices since an MLCC is small, ensures high capacity, and is easily mounted.

Particularly, a power supply device for a central processing unit (CPU) of a computer or the like may be negatively affected by voltage noise occurring due to a rapid change in a load current while a low voltage is provided. MLCCs have been widely used in power supply devices as decoupling capacitors used for suppressing voltage noise. In the case of MLCCs used for decoupling or the like, attempts have been made to reduce impedance of the MLCCs in a wide band.

SUMMARY

An aspect of the present disclosure provides a capacitor component having a plurality of resonance frequencies to effectively control impedance in a wide frequency band. Another aspect of the present disclosure provides a component having a reduced size by including the capacitor component described above.

According to an aspect of the present disclosure, a capacitor component includes a body and first and second external electrodes. The body includes a plurality of dielectric layers having a layered structure, and a first internal electrode and a second internal electrode alternately disposed with respective dielectric layers of the plurality of dielectric layers disposed therebetween. The first external electrode is disposed on a first surface and a second surface of the body opposing each other, and connected to the first internal electrode. The second external electrode is disposed on at least one of a third surface and a fourth surface of the body connecting the first surface to the second surface and opposing each other, and is connected to the second internal electrode. The first internal electrode and the second internal electrode provide a plurality of resonance frequencies.

Each of the first internal electrode and the second internal electrode may be divided into a plurality of regions to form capacitance with one or more internal electrodes adjacent thereto and having a polarity different therefrom.

In the first internal electrode, at least two of the plurality of regions may have sizes different from each other. In the second internal electrode, at least two of the plurality of regions may have sizes different from each other.

In the first internal electrode, each of the plurality of regions may be connected to the first external electrode by lead out portions exposed to the first surface and the second surface.

In the first internal electrode, one of the plurality of regions may be connected to the first external electrode by a lead out portion exposed to the first surface only among the first and second surfaces, and another of the plurality of regions may be connected to the first external electrode by a lead out portion exposed to the second surface only among the first and second surfaces.

The second external electrode may be disposed on the third surface and the fourth surface, and, in the second internal electrode, one of the plurality of regions may be connected to the second external electrode by a lead out portion exposed to the third surface and another of the plurality of regions may be connected to the second external electrode by a lead out portion exposed to the fourth surface.

The first internal electrode may include four or more of the plurality of regions.

A first gap may be disposed between regions of the first internal electrode, a second gap may be disposed between regions of the second internal electrode, and the first and second gaps may be disposed to overlap with each other in a stacking direction of layers of the body.

The first internal electrode and the second internal electrode may respectively comprise pluralities of first internal electrodes and second internal electrodes alternately stacked in the layered structure with respective dielectric layers of the plurality of dielectric layers disposed therebetween. The pluralities of first internal electrodes and second internal electrodes may be divided into a plurality of capacitor units having different resonance frequencies. The first internal electrodes may be connected to the first external electrode by first lead out portions exposed to the first surface and the second surface, and positions of the first lead out portions included in different capacitor units may be different from each other.

The second external electrode may be disposed on the third surface and the fourth surface. The second internal electrodes may be connected to the second external electrode by second lead out portions exposed to the third surface or fourth surface, and positions of the second lead out portions included in different capacitor units may be different from each other.

The first surface and the third surface may be disposed to be perpendicular to each other.

In the body, a marking unit indicating a mounting direction of the capacitor component may be provided. The marking unit may be formed of a ceramic material different from a material of other regions of the body.

The first internal electrode and the second internal electrode may be disposed to be perpendicular to the third surface.

According to another aspect of the present disclosure, a capacitor component includes a body and first and second external electrodes. The body includes a plurality of dielectric layers having a layered structure, and a first internal electrode and a second internal electrode alternately disposed with respective dielectric layers of the plurality of dielectric layers disposed therebetween. The first external electrode is disposed on a first surface and a second surface of the body opposing each other, is disposed on a third surface and a fourth surface connecting the first surface to the second surface and opposing each other, and is connected to the first internal electrode. The second external electrode is disposed between portions of the first external electrode on the third surface and the fourth surface, and is connected to the second internal electrode. Each of the first internal electrode and the second internal electrode is divided into a plurality of regions to form capacitance with one or more internal electrodes adjacent thereto and having a polarity different therefrom.

In the first internal electrode, one of the plurality of regions may be connected to the first external electrode by a lead out portion exposed to the third surface and another of the plurality of regions may be connected to the first external electrode by a lead out portion exposed to the fourth surface.

In the second internal electrode, one of the plurality of regions may be connected to the second external electrode by a lead out portion exposed to the third surface and another of the plurality of regions may be connected to the second external electrode by a lead out portion exposed to the fourth surface.

According to another aspect of the present disclosure, a capacitor component includes a body and first and second external electrodes. The body includes a plurality of dielectric layers having a layered structure, and pluralities of first internal electrodes and second internal electrodes alternately disposed with respective dielectric layers of the plurality of dielectric layers disposed therebetween. The first external electrode is disposed on a first surface and a second surface of the body opposing each other, and is connected to the first internal electrodes by lead out portions. The second external electrode is disposed on at least one of a third surface and a fourth surface of the body connecting the first surface to the second surface and opposing each other, and is connected to the second internal electrodes by lead out portions. The body includes first and second capacitor units disposed adjacent to each other in a stacking direction of layers of the body, and the first and second capacitor units include respective subsets of the pluralities first and second internal electrodes.

The first and second capacitor units may have different resonance frequencies.

Lead out portions of the first internal electrodes of the first capacitor unit may have positions different from those of lead out portions of the first internal electrodes of the second capacitor unit. Further, lead out portions of the first internal electrodes of the first and second capacitor units may each extend to both the first and second surfaces of the body.

Lead out portions of the second internal electrodes of the first capacitor unit may have positions different from those of lead out portions of the second internal electrodes of the second capacitor unit. Further, lead out portions of the second internal electrodes of the first capacitor unit may each extend to the third surface of the body and lead out portions of the second internal electrodes of the second capacitor unit may each extend to the fourth surface of the body.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
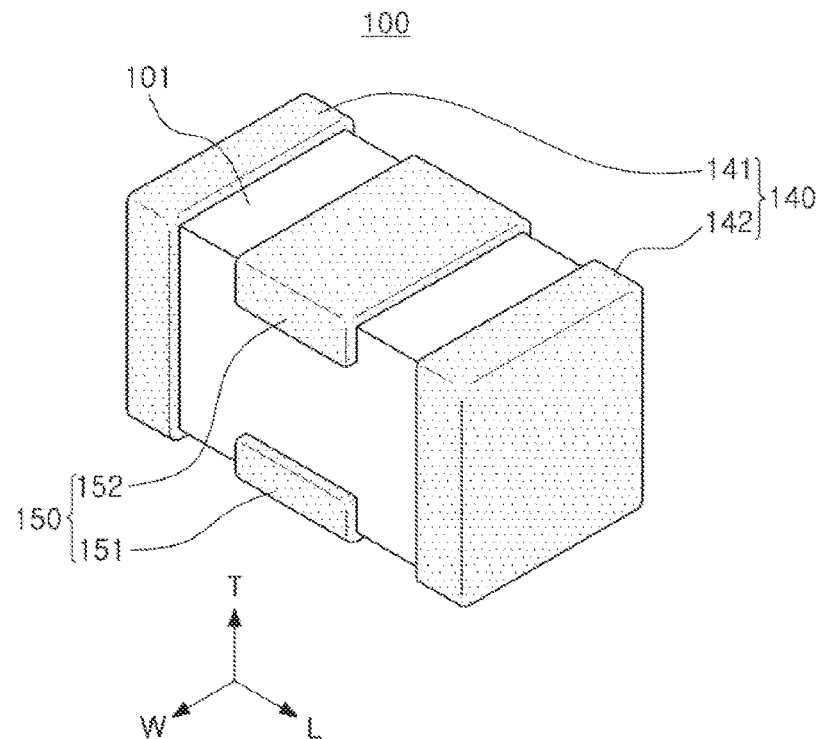
FIG. 1 is a perspective view schematically illustrating a capacitor component according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term. "and/or" includes any and all combinations of one or more of the associated listed items.

It will be apparent that though the terms first, second, third, etc. may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's positional relationship relative to other element(s) in the orientations shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on the particular direction of the figures or device. The device may be otherwise oriented (rotated 90 degrees or at other orientations) and the spatially relative descriptors used herein may be interpreted accordingly.

The terminology used herein describes particular illustrative embodiments only, and the present disclosure is not limited thereby. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, members, elements, and/or groups, but do not preclude the presence or addition of one or more other features, integers, steps, operations, members, elements, and/or groups.

Hereinafter, embodiments of the present disclosure will be described with reference to schematic views illustrating embodiments of the present disclosure. In the drawings, components having ideal shapes are shown. However, variations from these ideal shapes, for example due to variability in manufacturing techniques and/or tolerances, also fall within the scope of the disclosure. Thus, embodiments of the present disclosure should not be construed as being limited to the particular shapes of regions shown herein, but should more generally be understood to include changes in shape resulting from manufacturing methods and processes. The following embodiments may also be constituted by one or a combination thereof.

The present disclosure describes a variety of configurations, and only illustrative configurations are shown. However, the disclosure is not limited to the particular illustrative configurations presented herein, but extends to other similar/analogous configurations as well.

Figure 2:
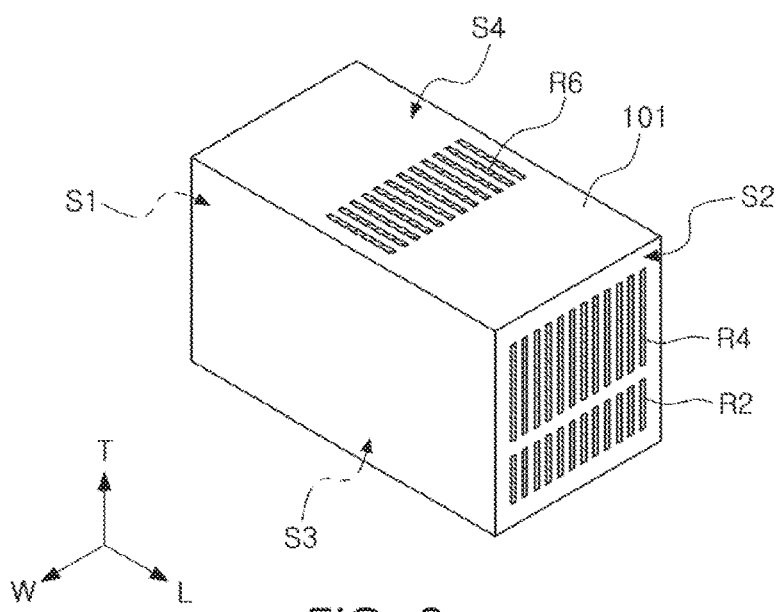
FIG. 2 is a perspective view schematically illustrating a body of the capacitor component of FIG. 1.
Figure 3:
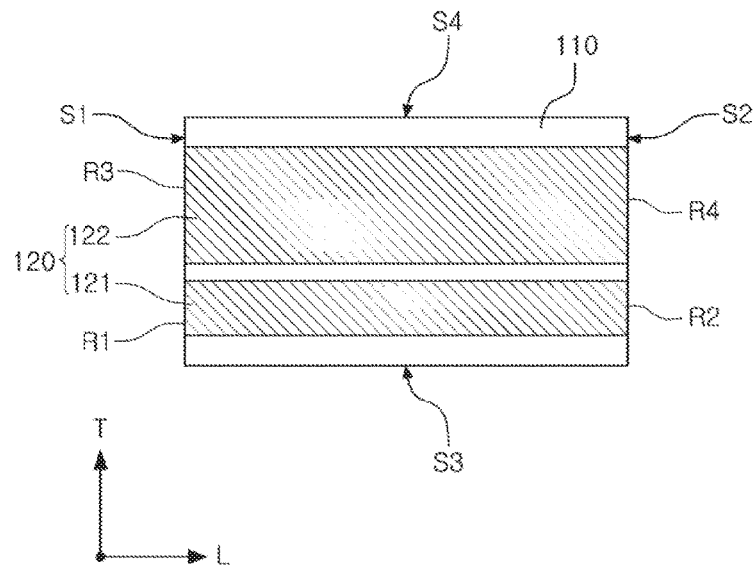
FIGS. 3 and 4 are plan views schematically illustrating a first internal electrode and a second internal electrode in the capacitor component of FIG. 1, respectively.
Figure 4:
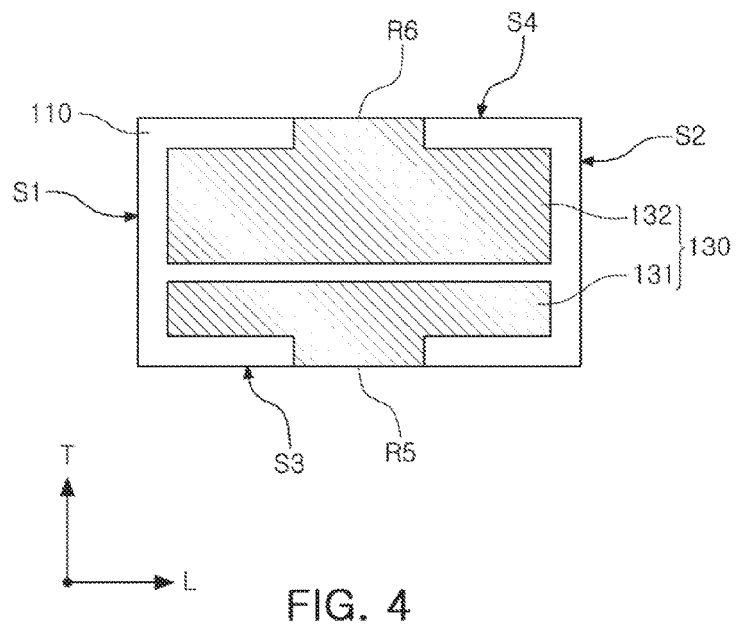
Figure 5:
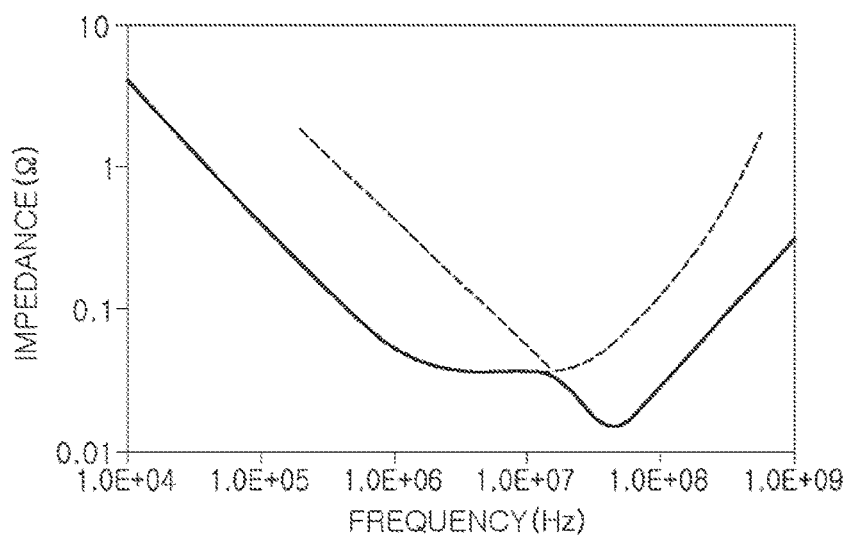
FIG. 5 is a graph illustrating impedance characteristics of a capacitor component obtained according to an exemplary embodiment.

FIG. 1 is a perspective view schematically illustrating a capacitor component 100 according to an exemplary embodiment. FIG. 2 is a perspective view schematically illustrating a form of a body 101 of a capacitor component 100 such as that shown in FIG. 1. FIGS. 3 and 4 are plan views schematically illustrating a form of a first internal electrode and a second internal electrode, respectively, in a capacitor component 100 such as that shown in FIG. 1. In addition, FIG. 5 is a graph illustrating impedance characteristics of a capacitor component 100 obtained according to an exemplary embodiment.

With reference to FIGS. 1 to 4, a capacitor component 100 according to an exemplary embodiment may include a body 101, a first internal electrode 120 and a second internal electrode 130 as well as a first external electrode 140 and a second external electrode 150. The first internal electrode 120 and the second internal electrode 130 may be divided into a plurality of regions to generate a plurality of resonance frequencies. In this case, the first external electrode 140 may be formed on a first surface S1 and a second surface S2 of the body 101 opposing each other and may be connected to the first internal electrode 120. In this case, the first surface S1 and a third surface S3 may be disposed to be perpendicular to each other, whereby the body 101 may have a hexahedral shape or a shape similar thereto.

The second external electrode 150 may be formed on the third surface S3 and a fourth surface S4 of the body 101 connecting the first surface S1 to the second surface S2 and opposing each other. The second external electrode 150 may be connected to the second internal electrode 130. In some examples, the second external electrode 150 may be formed on only one of the third surface S3 and the fourth surface S4. In an exemplary embodiment, the second external electrode 150 is exemplified as being formed on the third surface S3 and the fourth surface S4, and each of the second external electrode parts denoted 151 and 152 may be disposed on a respective one of the third and fourth surfaces.

The body 101 may include a plurality of dielectric layers 110 that are stacked together to form a layered structure, and one or plural first internal electrode(s) 120 and one or plural second internal electrode(s) 130 may be alternately disposed in the body 101 with a dielectric layer 110 disposed therebetween. The dielectric layer 110 included in the body 101 may be formed of a dielectric material such as a ceramic or the like known in the art, for example, a $BaTiO_3$ (barium titanate)-based ceramic powder or the like. In this case, the $BaTiO_3$-based ceramic powder may be, for example, $(Ba_{1-x}Ca_x)TiO_3$, $Ba(Ti_{1-y}Ca_y)O_3$, $(Ba_{1-x}Ca_x)Ti_{1-y}Zr_y)O_3$ or $Ba(Ti_{1-y}Zr_y)O_3$ in which a portion of calcium (Ca), zirconium (Zr), or the like is added to $BaTiO_3$, but is not limited thereto.

As illustrated in FIGS. 3 and 4, each of the first internal electrode 120 and the second internal electrode 130 is divided into a plurality of regions to form capacitance with an internal electrode adjacent thereto and having a polarity different therefrom, whereby a single capacitor component 100 may implement a plurality of (two in an exemplary embodiment) resonance frequencies. In detail, in an exemplary embodiment, the first internal electrode 120 is divided into two regions 121 and 122, and the two regions may have different sizes. Different levels of capacitance are implemented by the regions 121 and 122 having different sizes, and the regions 121 and 122 cause the capacitor component 100 to have a form in which two capacitors are connected to each other in parallel. In this case, in an exemplary embodiment, sizes of the two regions 121 and 122 are different from each other. However, in cases of internal electrodes (e.g., 120 and 130) having three or more regions, at least a portion (e.g., two or more) of the regions may have different sizes. In a manner similar thereto, the second internal electrode 130 may be divided into two regions 131 and 132, and the two regions may have different sizes.

In an exemplary embodiment, the first internal electrode 120 and the second internal electrode 130 may have differences in directions of lead out portions connected to the first external electrode 140 and the second external electrode 150 or the like. In detail, as illustrated in FIG. 3, a plurality of regions 121 and 122 divided from the first internal electrode 120 may be connected to the first external electrode 140 by lead out portions R1, R2, R3, and R4 exposed to the first surface S1 and the second surface S2. As illustrated in FIG. 4, in the second internal electrode 130, a region 131 of a plurality of regions 131 and 132 may be connected to a second external electrode 151 by a lead out portion R5 exposed to the third surface S3, and the other region 132 may be connected to a second external electrode 152 by a lead out portion R6 exposed to the fourth surface S4. As described above, the lead out portions R1 to R6 of the first internal electrode 120 and the second internal electrode 130 are disposed in different directions to allow a structure in which two capacitors are connected in parallel to be effective.

In other words, as illustrated in an impedance characteristics graph in FIG. 5, in the case of the capacitor component 100 according to an exemplary embodiment, two types of capacitors having different resonance frequencies are included within a single component, and impedance at a low level may be maintained in a wide frequency band. Thus, the capacitor component 100 described above is used to reduce the number of decoupling capacitors used in a power supply device or high-speed MPU or the like, and mounting costs or space of a decoupling capacitor may be effectively reduced.

Figure 6:
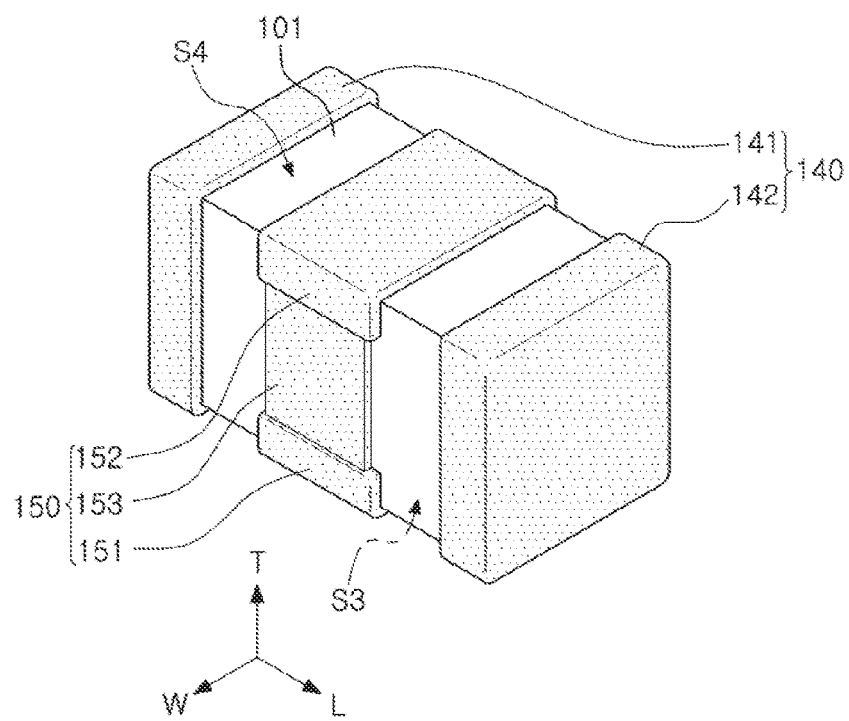
FIG. 6 and FIGS. 8 to 12 illustrate capacitor components according to modified examples, and illustrate bodies, internal electrodes, external electrodes, and the like employed therein.
Figure 7:
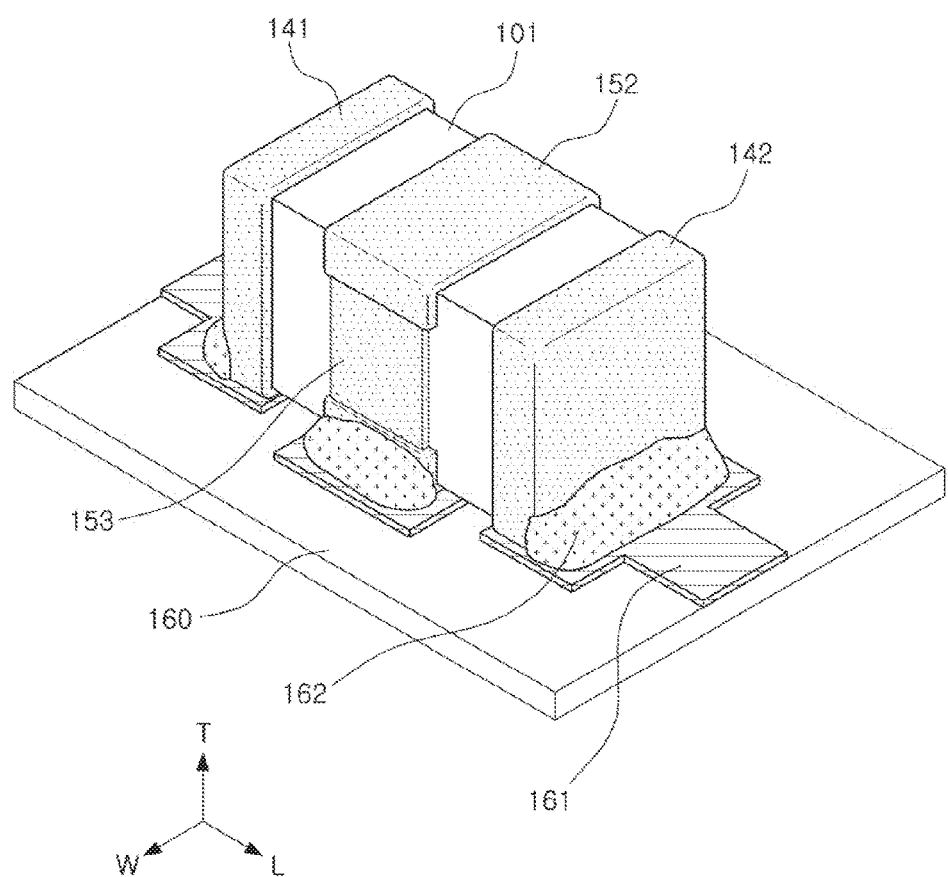
FIG. 7 illustrates a capacitor component that is mounted on a substrate according to an exemplary embodiment.

FIG. 6 and FIGS. 8 to 12 illustrate capacitor components according to modified examples in other exemplary embodiments. FIG. 7 illustrates an example in which a capacitor component according to an exemplary embodiment is mounted on a substrate 160. A mounting structure in FIG. 7 illustrates an example in which a capacitor component such as that shown in FIG. 6 is mounted, but a capacitor component according to another exemplary embodiment (such as that shown in FIG. 1) may be mounted in the same manner.

The exemplary embodiment of FIG. 6 differs from that of FIG. 1 in a form of the second external electrode 150 in which a connecting unit 153 is provided for connecting the second external electrode 151 of the second external electrode 150 formed on the third surface S3 to the second external electrode 152 formed on the fourth surface S4. A current loop formed between a signal terminal and a ground terminal by the connecting unit 153 may be easily formed.

A capacitor component mounting structure in FIG. 7 will be described hereinafter. A circuit pattern 161 may be formed on a mounting substrate 160, and a solder 162 may be provided for mounting a capacitor component on the circuit pattern 161. In this case, a capacitor component may be disposed in a vertical mounting method. In detail, the first internal electrode and the second internal electrode (120 and 130 in FIG. 3) may be disposed to be perpendicular to a mounting surface (a surface parallel to a third surface). For example, main surfaces of the first internal electrode and the second internal electrode (120 and 130 in FIG. 3) may be disposed to be perpendicular to the mounting surface. Lead out portions of each of the first internal electrode 120 and the second internal electrode and 130 may be disposed to be close to the mounting surface in the vertical mounting method to reduce equivalent series inductance (ESL) and impedance.

Figure 8:
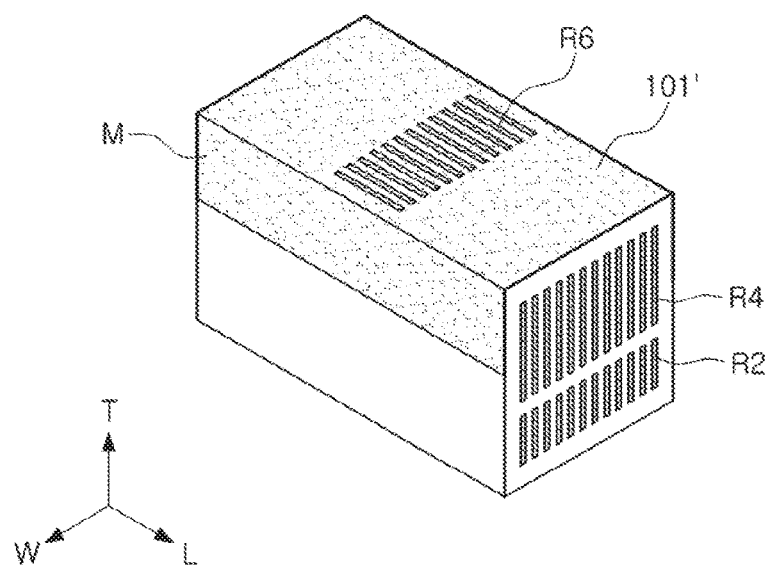

According to a modified example shown in FIG. 8, a body 101' of a capacitor component may include a marking unit M for indicating a mounting direction of a capacitor component, and the marking unit M may be formed of ceramic or other material different from that of other regions of the body 101'.

Figure 9:
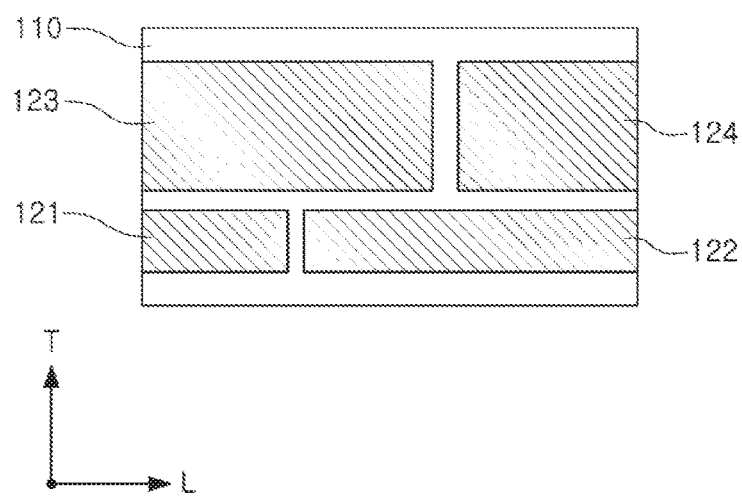
Figure 10:
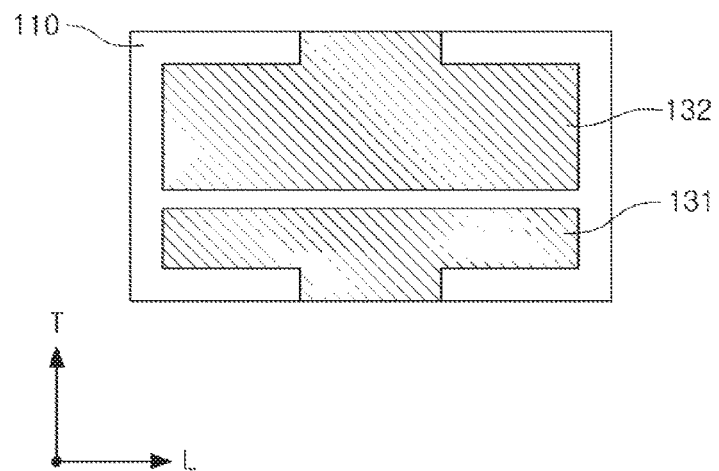

With reference to FIGS. 9 and 10, a form of an internal electrode to be employed in a modified example will be described. In the case of a modified example, a greater number (e.g., four) of resonance frequencies may be implemented in a different manner from an exemplary embodiment described previously. To this end, as illustrated in FIG. 9, the first internal electrode 120 may include four (or more) divided regions 121, 122, 123, and 124. In this case, in the case of the second internal electrode 130, the second internal electrode may be divided into four or more regions in a manner similar to the first internal electrode. However, as illustrated in FIG. 10, even though the second internal electrode includes two divided regions 131 and 132, the two divided regions may be combined with divided regions of a first internal electrode adjacent thereto to obtain four resonance frequencies.

Figure 11:
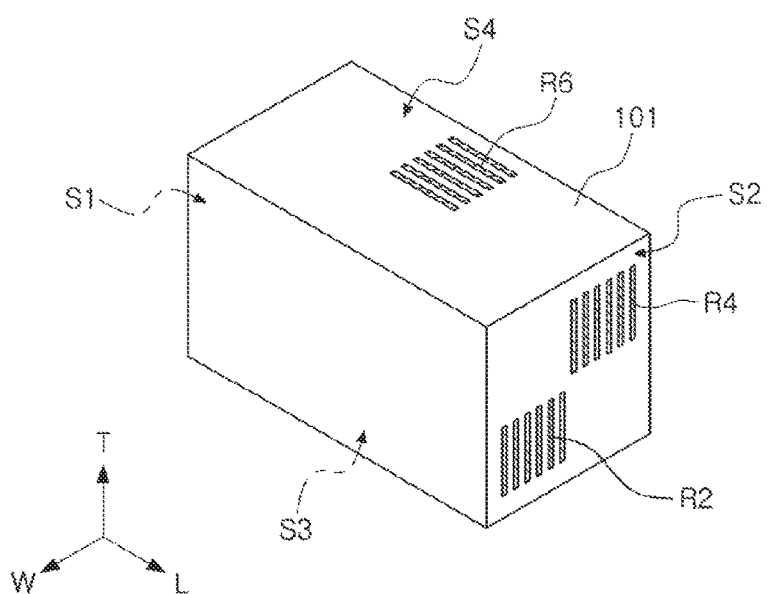
Figure 12:
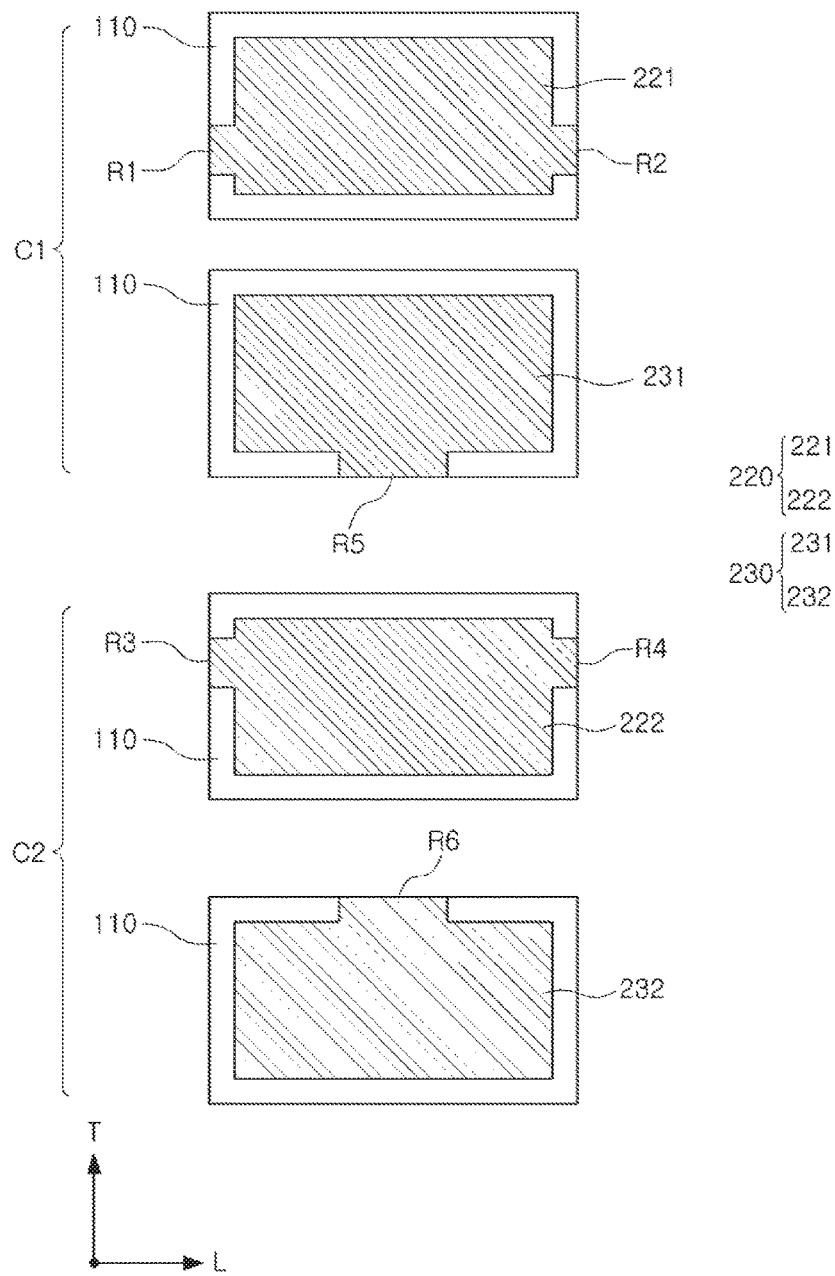

With reference to FIGS. 11 and 12, another modified example will be described. In an exemplary embodiment described previously, an internal electrode is divided into a plurality of regions to obtain a plurality of resonance frequencies. However, in a further exemplary embodiment, a plurality of resonance frequencies may be implemented regardless of a divided structure. In detail, in the further exemplary embodiment, a first internal electrode 220 may be connected to the first external electrode 140 by lead out portions R1 and R3 exposed to the first surface S1 and lead out portions R2 and R4 exposed to the second surface S2, and positions of the lead out portions R1, R2, R3, and R4 included in each of first internal electrode layers 221 and 222 positioned on different layers may be different. In other words, when viewed based on a layering direction, the lead out portion R1 of the first internal electrode 220 may be disposed so as not to be overlapped with the lead out portion R3 of the first internal electrode 222 on the first surface S1. In a manner similar thereto, the lead out portions R2 and R4 led out to the second surface S2 from the first internal electrode 220 may be disposed not to be overlapped with each other in a layering direction.

In the case of a second internal electrode 230, second internal electrode layers 231 and 232 positioned on different layers may allow lead out portions R5 and R6 to be lead out in different directions. In other words, the lead out portion R5 of the second internal electrode layer 231 may be exposed to the third surface S3 to be connected to the second external electrode 151, and the lead out portion R6 of the second internal electrode layer 232 may be exposed to the fourth surface S4 to be connected to the second external electrode 152.

The first internal electrode 220 and the second internal electrode 230 may have a form illustrated in FIG. 12 and may form a first capacitor unit C1 and a second capacitor unit C2 as illustrated in FIGS. 11 and 12. In addition, the first capacitor unit C1 and the second capacitor unit C2 differ in positions in which lead out portions are disposed. In other words, the first internal electrode 220 and the second internal electrode 230 may be divided into a plurality of capacitor units, and the first capacitor unit C1 and the second capacitor unit C2 may have different resonance frequencies. In addition, lead out portions included in internal electrodes having the same polarity and included in the first capacitor unit C1 and the second capacitor unit C2 different from each other, may be disposed in different positions.

In detail, the first internal electrode 221 and the second internal electrode 231 are alternately disposed to form the first capacitor unit C1. In this case, the first capacitor unit C1 may be spaced apart from the second capacitor unit C2. In addition, the first internal electrode 222 and the second internal electrode 232 are alternately disposed to form the second capacitor unit C2, and a current path of the second capacitor unit is different from that of the first capacitor unit C1. Due to a structure described above, the first capacitor unit C1 and the second capacitor unit C2 may be provided as different capacitors, and two resonance frequencies may be effectively implemented in a single capacitor component 101.

Figure 13:
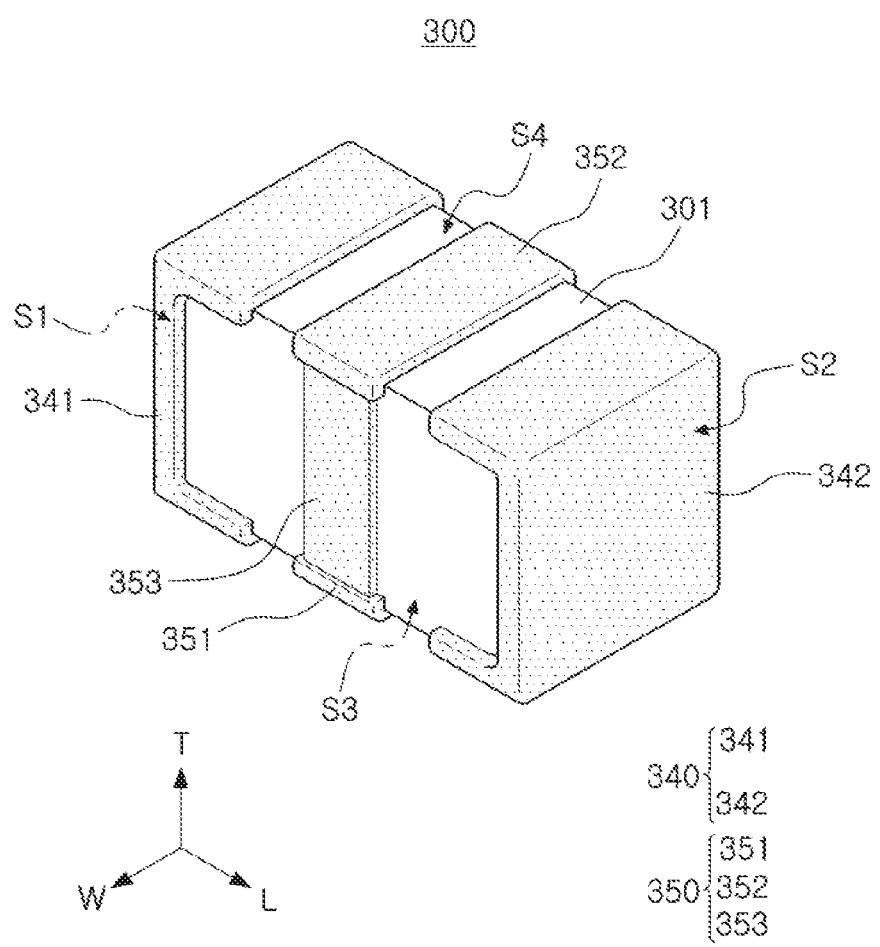
FIG. 13 is a perspective view schematically illustrating a capacitor component according to a further exemplary embodiment.
Figure 14:
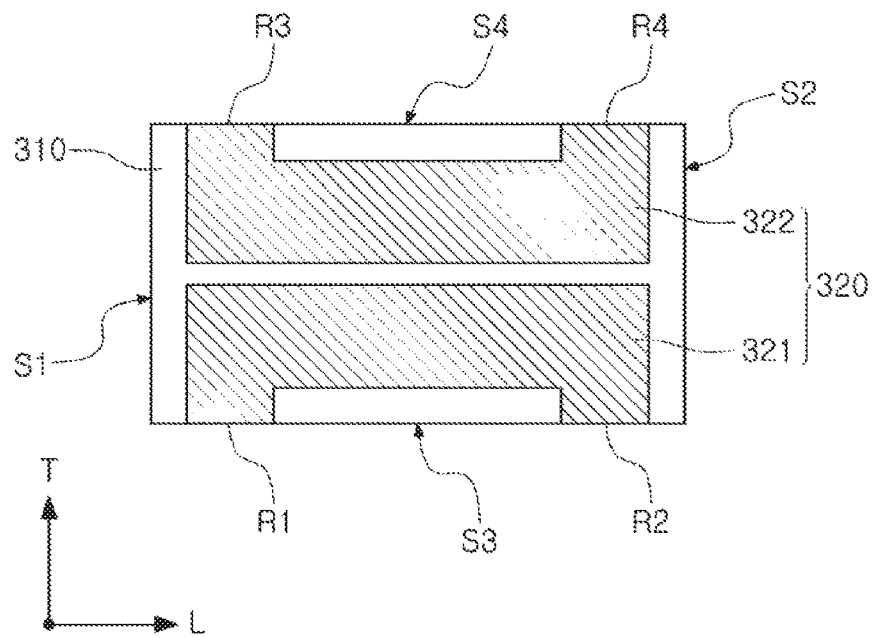
FIGS. 14 and 15 are plan views schematically illustrating a first internal electrode and a second internal electrode in the capacitor component of FIG. 13, respectively.
Figure 15:
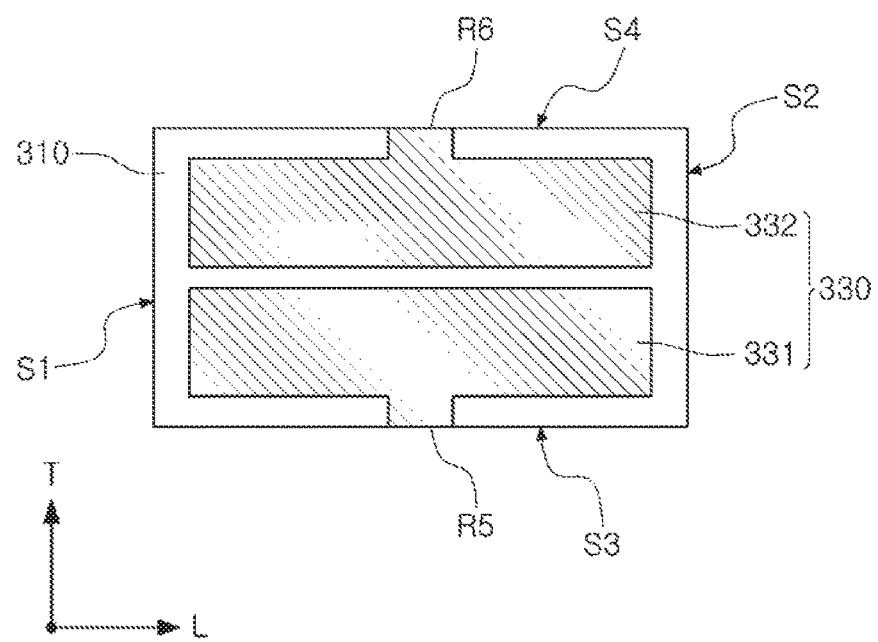

With reference to FIGS. 13 to 15, another exemplary embodiment will be described. FIG. 13 is a perspective view schematically illustrating a capacitor component 300 according to another exemplary embodiment. FIGS. 14 and 15 are plan views schematically illustrating a form of a first internal electrode 320 and a second internal electrode 330 in the capacitor component 300 in FIG. 13, respectively.

In the other exemplary embodiment, the capacitor component 300 may include a body 301 including a plurality of dielectric layers 310, one or plural first internal electrode(s) 320, and one or plural second internal electrode(s) 330 as well as a first external electrode 340 and a second external electrode 350 formed outside the body 301. Each of the first internal electrode(s) 320 and the second internal electrode(s) 330 is divided into a plurality of regions to form capacitance with internal electrode(s) adjacent thereto and having a polarity different therefrom. In this case, as illustrated in FIG. 13, the first external electrode 340 may be formed on the first surface S1 and the second surface S2 of the body 301 opposing each other as well as on the third surface S3 and the fourth surface S4 connecting the first surface S1 to the second surface S2 and opposing each other, and a first external electrode portion formed on the first surface S1 is denoted 341 and a first external electrode portion formed on the second surface S2 is denoted 342.

The second external electrode 350 may be formed on the third surface S3 and the fourth surface S4 between the portions of the first external electrode 340, and may be connected to the second internal electrode 330. In FIG. 13, the second external electrode 350 has a form including a second external electrode portion 351 formed on the third surface S3 and a second external electrode portion 352 formed on the fourth surface S4, but may include only one thereof. When the second external electrode 350 is formed on the third surface S3 and the fourth surface S4, a connecting unit 353 for connecting the second external electrode portions may be formed in a manner similar to an exemplary embodiment described previously.

In an exemplary embodiment, to implement a plurality of resonance frequencies, each of the first internal electrode(s) 320 and the second internal electrode(s) 330 may include a plurality of divided regions, and a form in which a lead out portion is led out differs from an exemplary embodiment described previously. In detail, as illustrated in FIG. 14, in the case of the first internal electrode 320, one region 321 of a plurality of regions is connected to the first external electrode 340 by lead out portions R1 and R2 exposed to the third surface S3. In this case, lead out portions R1 and R2 may be provided as two lead out portions. In addition, the other region 322 of the plurality of divided regions of the first internal electrode 320 may be connected to the first external electrode 340 by lead out portions R3 and R4 exposed to the fourth surface S4, and the lead out portions R3 and R4 may be provided as to two lead out portions.

As illustrated in FIG. 15, in the case of the second internal electrode 330, one region 331 of a plurality of regions may be connected to the second external electrode 350 by a lead out portion R5 exposed to the third surface S3. In further detail, the one region 331 may be connected to a second external electrode portion 351 of the second external electrode 350 formed on the third surface S3, and a lead out portion R5 may be provided as one lead out portion and may be disposed between the lead out portions R1 and R2 of the first internal electrode 320. In addition, the other region 332 of the plurality of divided regions of the second internal electrode 330 may be connected to the second external electrode 350 by a lead out portion R6 exposed to the fourth surface S4. In further detail, the other region 332 may be connected to a second external electrode 352 of the second external electrode 350 formed on the fourth surface S4, and the lead out portion R6 is provided as one lead out portion and may be disposed between the lead out portions R3 and R4 of the first internal electrode 320.

According to an exemplary embodiment, a plurality of resonance frequencies may be effectively implemented by a divided structure of internal electrodes 320 and 330 and a lead out portioning method of lead out portions R1 to R6. In addition, in the case of an exemplary embodiment in FIGS. 14 and 15, a distance between lead out portions R1 to R6 in internal electrodes 320 and 330 adjacent thereto may be reduced, thereby reducing ESL.

As set forth above, according to an exemplary embodiment, an impedance reduced capacitor component for effectively removing a noise from a wide frequency band may be obtained.

While exemplary embodiments have been shown and described above, it will be apparent to those skilled in the art that modifications and variations could be made without departing from the scope of the present invention as defined by the appended claims.

What is claimed is:

1. A capacitor component comprising:
a body including a plurality of dielectric layers having a layered structure, and a first internal electrode and a second internal electrode alternately disposed with respective dielectric layers of the plurality of dielectric layers disposed therebetween;
a first external electrode disposed on a first surface and a second surface of the body opposing each other, and connected to the first internal electrode; and
a second external electrode disposed on at least one of a third surface and a fourth surface of the body connecting the first surface to the second surface and opposing each other, and connected to the second internal electrode,
wherein the first internal electrode and the second internal electrode provide a plurality of resonance frequencies, and
wherein at least one of the first internal electrode or the second internal electrode is divided into a plurality of regions, which are spaced apart from each other, to form capacitance with one or more internal electrodes adjacent thereto and having a polarity different therefrom.

2. The capacitor component of claim 1, wherein, in the first internal electrode, at least two of the plurality of regions have sizes different from each other.

3. The capacitor component of claim 1, wherein, in the second internal electrode, at least two of the plurality of regions have sizes different from each other.

4. The capacitor component of claim 1, wherein, in the first internal electrode, each of the plurality of regions is connected to the first external electrode by lead out portions exposed to the first surface and the second surface.

5. The capacitor component of claim 1, wherein, in the first internal electrode, one of the plurality of regions is connected to the first external electrode by a lead out portion exposed to the first surface only among the first and second surfaces, and another of the plurality of regions is connected to the first external electrode by a lead out portion exposed to the second surface only among the first and second surfaces.

6. The capacitor component of claim 1, wherein the second external electrode is disposed on the third surface and the fourth surface, and
in the second internal electrode, one of the plurality of regions is connected to the second external electrode by a lead out portion exposed to the third surface and another of the plurality of regions is connected to the second external electrode by a lead out portion exposed to the fourth surface.

7. The capacitor component of claim 1, wherein the first internal electrode includes four or more of the plurality of regions.

8. The capacitor component of claim 1, wherein a first gap is disposed between regions of the first internal electrode, a second gap is disposed between regions of the second internal electrode, and the first and second gaps are disposed to overlap with each other in a stacking direction of layers of the body.

9. The capacitor component of claim 1, wherein the first internal electrode and the second internal electrode respectively comprise pluralities of first internal electrodes and second internal electrodes alternately stacked in the layered structure with respective dielectric layers of the plurality of dielectric layers disposed therebetween, wherein the pluralities of first internal electrodes and second internal electrodes are divided into a plurality of capacitor units having different resonance frequencies, and the first internal electrodes are connected to the first external electrode by first lead out portions exposed to the first surface and the second surface, and positions of the first lead out portions included in different capacitor units are different from each other.

10. The capacitor component of claim 9, wherein the second external electrode is disposed on the third surface and the fourth surface, and the second internal electrodes are connected to the second external electrode by second lead out portions exposed to the third surface or the fourth surface, and positions of the second lead out portions included in different capacitor units are different from each other.

11. The capacitor component of claim 1, wherein the first surface and the third surface are disposed to be perpendicular to each other.

12. The capacitor component of claim 1, wherein a marking unit indicating a mounting direction of the capacitor component is provided in the body.

13. The capacitor component of claim 12, wherein the marking unit is formed of a ceramic material different from a material of other regions of the body.

14. The capacitor component of claim 1, wherein the first internal electrode and the second internal electrode are disposed to be perpendicular to the third surface.

15. A capacitor component comprising:
a body including a plurality of dielectric layers having a layered structure, and a first internal electrode and a second internal electrode alternately disposed with respective dielectric layers of the plurality of dielectric layers disposed therebetween;
a first external electrode disposed on a first surface and a second surface of the body opposing each other, disposed on a third surface and a fourth surface connecting the first surface to the second surface and opposing each other, and connected to the first internal electrode; and
a second external electrode disposed between portions of the first external electrode on the third surface and the fourth surface, and connected to the second internal electrode,
wherein at least one of the first internal electrode or the second internal electrode is divided into a plurality of regions, which are spaced apart from each other, to form capacitance with one or more internal electrodes adjacent thereto and having a polarity different therefrom.

16. The capacitor component of claim 15, wherein, in the first internal electrode, one of the plurality of regions is connected to the first external electrode by a lead out portion exposed to the third surface and another of the plurality of regions is connected to the first external electrode by a lead out portion exposed to the fourth surface.

17. The capacitor component of claim 15, wherein, in the second internal electrode, one of the plurality of regions is connected to the second external electrode by a lead out portion exposed to the third surface and another of the plurality of regions is connected to the second external electrode by a lead out portion exposed to the fourth surface.

18. A capacitor component comprising:
a body including a plurality of dielectric layers having a layered structure, and pluralities of first internal electrodes and second internal electrodes alternately disposed with respective dielectric layers of the plurality of dielectric layers disposed therebetween;
a first external electrode disposed on a first surface and a second surface of the body opposing each other, and connected to the first internal electrodes by lead out portions; and
a second external electrode disposed on at least one of a third surface and a fourth surface of the body connecting the first surface to the second surface and opposing each other, and connected to the second internal electrodes by lead out portions,
wherein the body includes first and second capacitor units disposed adjacent to each other in a stacking direction of layers of the body, and the first and second capacitor units include respective subsets of the pluralities of first and second internal electrodes, and
the lead out portions of the pluralities of first and second internal electrodes are not overlapped with each other in the stacking direction.

19. The capacitor component of claim 18, wherein the first and second capacitor units have different resonance frequencies.

20. The capacitor component of claim 18, wherein lead out portions of the first internal electrodes of the first capacitor unit have positions different from those of lead out portions of the first internal electrodes of the second capacitor unit.

21. The capacitor component of claim 20, wherein lead out portions of the first internal electrodes of the first and second capacitor units each extend to both the first and second surfaces of the body.

22. The capacitor component of claim 18, wherein lead out portions of the second internal electrodes of the first capacitor unit have positions different from those of lead out portions of the second internal electrodes of the second capacitor unit.

23. The capacitor component of claim 22, wherein lead out portions of the second internal electrodes of the first capacitor unit each extend to the third surface of the body and lead out portions of the second internal electrodes of the second capacitor unit each extend to the fourth surface of the body.

24. A capacitor component comprising:
a body including a plurality of dielectric layers having a layered structure, and a first internal electrode and a second internal electrode alternately disposed with respective dielectric layers of the plurality of dielectric layers disposed therebetween;
a first external electrode disposed on a first surface and a second surface of the body opposing each other, and connected to the first internal electrode; and
a second external electrode disposed on at least one of a third surface and a fourth surface of the body connecting the first surface to the second surface and opposing each other, and connected to the second internal electrode,
wherein the first internal electrode and the second internal electrode provide a plurality of resonance frequencies, the first internal electrode and the second internal electrode respectively comprise pluralities of first internal electrodes and second internal electrodes alternately stacked in the layered structure with respective dielectric layers of the plurality of dielectric layers disposed therebetween, wherein the pluralities of first internal electrodes and second internal electrodes are divided into a plurality of capacitor units having different resonance frequencies, and the first internal electrodes are connected to the first external electrode by first lead out portions exposed to the first surface and the second surface, and positions of the first lead out portions included in different capacitor units are different from each other.

* * * * *